(12) United States Patent
Zhang et al.

(10) Patent No.: US 12,382,811 B2
(45) Date of Patent: Aug. 5, 2025

(54) DISPLAY SUBSTRATE AND RELATED DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Zhang, Beijing (CN); Quan Shi, Beijing (CN); Benlian Wang, Beijing (CN); Longhui Xue, Beijing (CN); Ming Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 379 days.

(21) Appl. No.: 17/595,513

(22) PCT Filed: Jan. 4, 2021

(86) PCT No.: PCT/CN2021/070131
§ 371 (c)(1),
(2) Date: Nov. 18, 2021

(87) PCT Pub. No.: WO2022/141628
PCT Pub. Date: Jul. 7, 2022

(65) Prior Publication Data
US 2023/0084896 A1    Mar. 16, 2023

(51) Int. Cl.
H01L 27/32 (2006.01)
H10K 50/842 (2023.01)
(Continued)

(52) U.S. Cl.
CPC ....... *H10K 59/353* (2023.02); *H10K 50/8428* (2023.02); *H10K 59/352* (2023.02); *H10K 59/122* (2023.02)

(58) Field of Classification Search
CPC ......... H10K 59/122; H10K 59/35–353; H10K 59/8723; H10K 50/8428
See application file for complete search history.

(56) References Cited

U.S. PATENT DOCUMENTS 9,406,723 B2    8/2016  Lee
11,785,821 B2 * 10/2023  Luo ........................ H10K 71/00
(Continued)

FOREIGN PATENT DOCUMENTS

CN    106486513 A    3/2017
CN    106486514 A    3/2017
(Continued)

*Primary Examiner* — Victoria K. Hall
(74) *Attorney, Agent, or Firm* — BROOKS KUSHMAN P.C.

(57) ABSTRACT

A display substrate and a related device. The display substrate includes a plurality of first subpixels, a plurality of second subpixels and a plurality of third subpixels. In a first direction, the first subpixels and the third subpixels are arranged alternately to form a plurality of first subpixel rows, the second subpixels are arranged to form a plurality of second subpixel rows, and the first subpixel rows and the second subpixel rows are arranged alternately in a second direction. Lines connecting centers of two first subpixels and two third subpixels in two adjacent rows and columns form a first virtual quadrilateral, the two first/third subpixels are arranged at two/the other two opposite vertices of the first virtual quadrilateral respectively, and a corresponding second subpixel is located within the first virtual quadrilateral.

18 Claims, 7 Drawing Sheets

(51) Int. Cl.
    *H10K 59/35*         (2023.01)
    *H10K 59/122*      (2023.01)

(56) References Cited

U.S. PATENT DOCUMENTS

| | | | |
|---|---|---|---|
| 2014/0220715 A1* | 8/2014 | Kang | H10K 71/166 |
| | | | 118/504 |
| 2016/0254476 A1* | 9/2016 | Park | H10K 50/813 |
| | | | 257/40 |
| 2018/0151637 A1* | 5/2018 | Kajiyama | H10K 59/353 |
| 2018/0247984 A1 | 8/2018 | Wang et al. | |
| 2019/0035861 A1 | 1/2019 | Wang et al. | |
| 2019/0252469 A1* | 8/2019 | Xiao | G09G 3/3225 |
| 2021/0132720 A1* | 5/2021 | Lee | H10K 50/865 |
| 2021/0135149 A1* | 5/2021 | Xin | H10K 59/80522 |
| 2021/0175295 A1* | 6/2021 | Lee | H10K 59/87 |

FOREIGN PATENT DOCUMENTS

| | | |
|---|---|---|
| CN | 207966988 U | 10/2018 |
| CN | 208077981 A | 11/2018 |
| CN | 110828534 A | 2/2020 |
| CN | 111341815 A | 6/2020 |
| CN | 111341817 A | 6/2020 |
| CN | 111785755 A | 10/2020 |

\* cited by examiner

--Prior Art--

--Prior Art--

--Prior Art--

--Prior Art--

DISPLAY SUBSTRATE AND RELATED DEVICE

CROSS-REFERENCE TO RELATED APPLICATION

This application is the U.S. national phase of PCT Application No. PCT/CN2021/070131 filed on Jan. 4, 2021, which is incorporated herein by reference in its entirety.

TECHNICAL FIELD

The present disclosure relates to the field of display technology, in particular to a display substrate and a display device.

BACKGROUND

Organic Light-Emitting Diode (OLED) display device is a research hotspot in the field of flat-panel display. As compared with a liquid crystal display, the OLED display device has such advantages as low power consumption, low manufacture cost, self-luminescence, wide viewing angle and rapid response. Currently, in the field of flat-panel display, the OLED display device has started to replace a conventional Liquid Crystal Display (LCD).

The OLED display device mainly includes a base substrate and pixels arranged on the base substrate in an array form. Usually, for each pixel, an organic electroluminescent structure is formed at a position corresponding to the pixel on an array substrate through evaporating an organic material with a Fine Metal Mask (FMM).

However, for the FMM, there currently exist such phenomena as difficulty in expansion and uneven stress, so a risk of crosstalk easily occurs.

SUMMARY

An object of the present disclosure is to provide a display substrate and a display device, so as to reduce the risk of crosstalk for the display substrate.

In order to solve the above-mentioned technical problem, the present disclosure provides the following technical solutions.

In one aspect, the present disclosure provides in some embodiments a display substrate, including a plurality of first subpixels, a plurality of second subpixels and a plurality of third subpixels. In a first direction, the first subpixels and the third subpixels are arranged alternately to form a plurality of first subpixel rows, the second subpixels are arranged to form a plurality of second subpixel rows, and the first subpixel rows and the second subpixel rows are arranged alternately in a second direction. Lines connecting centers of two first subpixels and two third subpixels in two adjacent rows and two adjacent columns form a first virtual quadrilateral, the two first subpixels are arranged at two opposite vertices of the first virtual quadrilateral respectively, the two third subpixels are arranged at the other two opposite vertices of the first virtual quadrilateral respectively, and a corresponding second subpixel is located within the first virtual quadrilateral. Lines connecting centers of two second subpixels, one first subpixel and one third subpixel in adjacent three rows and adjacent three columns form a virtual parallelogram, the two second subpixels A and B are arranged at two opposite vertices of the virtual parallelogram respectively, the first subpixel and the third subpixel are arranged at the other two opposite vertices of the virtual parallelogram respectively, a line connecting the centers of the second subpixel A and the third subpixel is located on a first straight line, a distance between an orthogonal projection of the center of the first subpixel onto the first straight line and the center of the second subpixel A is x, an interior angle of the virtual parallelogram which is smaller than 90° is within a range of (h−10°, h+10°), and h is calculated through $$h = \arctan\left(\frac{x}{P}\right),$$

where P is a half of a distance between the centers of two odd-numbered or even-numbered second subpixels arranged closest to each other in each second subpixel row.

In a possible embodiment of the present disclosure, x is within a range of 3 μm to 5 μm.

In a possible embodiment of the present disclosure, the interior angle is greater than or equal to 70° and smaller than 90°.

In a possible embodiment of the present disclosure, a line connecting the centers of the first subpixel and the third subpixel adjacent to each other in the first direction is angled relative to the first direction by an angle d, a line connecting the centers of the first subpixel and the third subpixel adjacent to each other in the second direction is angled relative to the second direction by an angle e, the angle d is greater than 0° and smaller than 30°, and the angle e is greater than 0° and smaller than 30°.

In a possible embodiment of the present disclosure, the first direction is approximately perpendicular to the second direction, the first direction is one of a row direction and a column direction, and the second direction is the other one of the row direction and the column direction.

In a possible embodiment of the present disclosure, four first virtual quadrilaterals in two columns and two rows are arranged in such a manner as to share common sides to form a second virtual polygon, and the second virtual polygon includes four second subpixels, five first subpixels and four third subpixels. The four second subpixels are located within the four first virtual quadrilaterals respectively, one first subpixel is surrounded by the four second subpixels, the other four first subpixels and the four third subpixels are arranged at sides or vertices of the second virtual polygon respectively, and the four first subpixels and the four third subpixels at the sides or vertices of the second virtual polygon are arranged alternately in a clockwise direction and a counterclockwise direction along the sides of the second virtual polygon. Lines connecting the centers of the four first subpixels at the sides or vertices of the second virtual polygon approximately form a virtual parallelogram, and/or lines connecting the centers of the four third subpixels at the sides or vertices of the second virtual polygon approximately form a virtual parallelogram.

In a possible embodiment of the present disclosure, a line connecting centers of at least a part of the first subpixels is approximately located on a third straight line, a line connecting centers of at least a part of the third subpixels is approximately located on a fourth straight line, and the third straight line is approximately parallel to the fourth straight line.

In a possible embodiment of the present disclosure, the third straight line and the fourth straight line do not coincide with each other, and are approximately parallel to the first direction or the second direction.

In a possible embodiment of the present disclosure, a line connecting the centers of at least a part of the second subpixels in a same second pixel row is approximately located on a fifth straight line approximately parallel to the third straight line and the fourth straight line.

In a possible embodiment of the present disclosure, a line connecting the centers of the second subpixels adjacent to each other in the first direction is angled relative to the first direction by an angle f, a line connecting the centers of the second subpixels adjacent to each other in the second direction is angled relative to the second direction by an angle g, the angle f is greater than 0° and smaller than 30°, and the angle g is greater than 0° and smaller than 30°.

In a possible embodiment of the present disclosure, four third subpixels are arranged adjacent to each first subpixel, and distances between the center of the first subpixel and the centers of at least two of the four third subpixels are different from each other. Four first subpixels are arranged adjacent to each third subpixel, and distances between the center of the third subpixel and the centers of at least two of the four first subpixels are different from each other.

In a possible embodiment of the present disclosure, the display substrate includes a plurality of pixel repetition units. Each pixel repetition unit includes two first subpixels and two third subpixels belonging to a same first virtual quadrilateral, and further includes four second subpixels belonging to a same second virtual polygon as one of the two first subpixels and surrounding the first subpixel.

In a possible embodiment of the present disclosure, each second subpixel is of an octagonal shape.

In a possible embodiment of the present disclosure, the first subpixels have a same area, and/or the third subpixels have a same area, and/or the second subpixels have a same area.

In a possible embodiment of the present disclosure, each first subpixel has an area of S, each second subpixel has an area of f*S, and each third subpixel has an area of g*S, where $0.5 \leq f \leq 0.8$ and $1 \leq g \leq 2.2$.

In a possible embodiment of the present disclosure, the first subpixels have an approximately same shape, and/or the third subpixels have an approximately same shape, and/or the second subpixels have an approximately same shape.

In a possible embodiment of the present disclosure, each of the first subpixels and the third subpixels has a shape of polygon, circle or oval.

In a possible embodiment of the present disclosure, each of the first subpixels and the third subpixels has a shape of quadrilateral, hexagon, octagon, quadrilateral with rounded angles, hexagon with rounded angles, octagon with rounded angles, circle or oval.

In a possible embodiment of the present disclosure, the first subpixel is a red subpixel, the third subpixel is a blue subpixel and the second subpixel is a green subpixel; or the first subpixel is a blue subpixel, the third subpixel is a red subpixel and the second subpixel is a green subpixel; or the first subpixel is a green subpixel, the third subpixel is a red subpixel and the second subpixel is a blue subpixel; or the first subpixel is a green subpixel, the third subpixel is a blue subpixel and the second subpixel is a red subpixel.

In another aspect, the present disclosure provides in some embodiments a display device including the above-mentioned display substrate.

In a possible embodiment of the present disclosure, the display device further includes a pixel definition layer, the pixel definition layer includes a plurality of pixel definition layer openings, the first subpixels, the second subpixels and the third subpixels correspond to the pixel definition layer openings respectively, and a shape of each of the first subpixels, the second subpixels and the third subpixels is approximately same to a shape of the corresponding pixel definition layer opening.

In a possible embodiment of the present disclosure, each first subpixel includes a plurality of film layers at least partially covering a region beyond the corresponding pixel definition layer opening, and/or each second subpixel includes a plurality of film layers at least partially covering a region beyond the corresponding pixel definition layer opening, and/or each third subpixel includes a plurality of film layers at least partially covering a region beyond the corresponding pixel definition layer opening.

In a possible embodiment of the present disclosure, at least a part of the pixel definition layer openings have different shapes or areas.

In a possible embodiment of the present disclosure, the pixel definition layer openings include second pixel definition layer openings corresponding to the second subpixels, and a distance between boundaries of at least a part of the adjacent second pixel definition layer openings is greater than a predetermined threshold.

In a possible embodiment of the present disclosure, the display device further includes a spacer adjacent to two second subpixels, one first subpixel and one third subpixel, and a minimum distance between boundaries of the first subpixel and the third subpixel is greater than a minimum distance between boundaries of at least a part of the first subpixels and the third subpixels adjacent to each other.

BRIEF DESCRIPTION OF THE DRAWINGS

-FIGS. 11 and 12 are schematic views showing the display substrate according to one embodiment of the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments.

An object of the present disclosure is to provide a display substrate and a display device, so as to reduce a risk of crosstalk for the display substrate.

Figure 12:
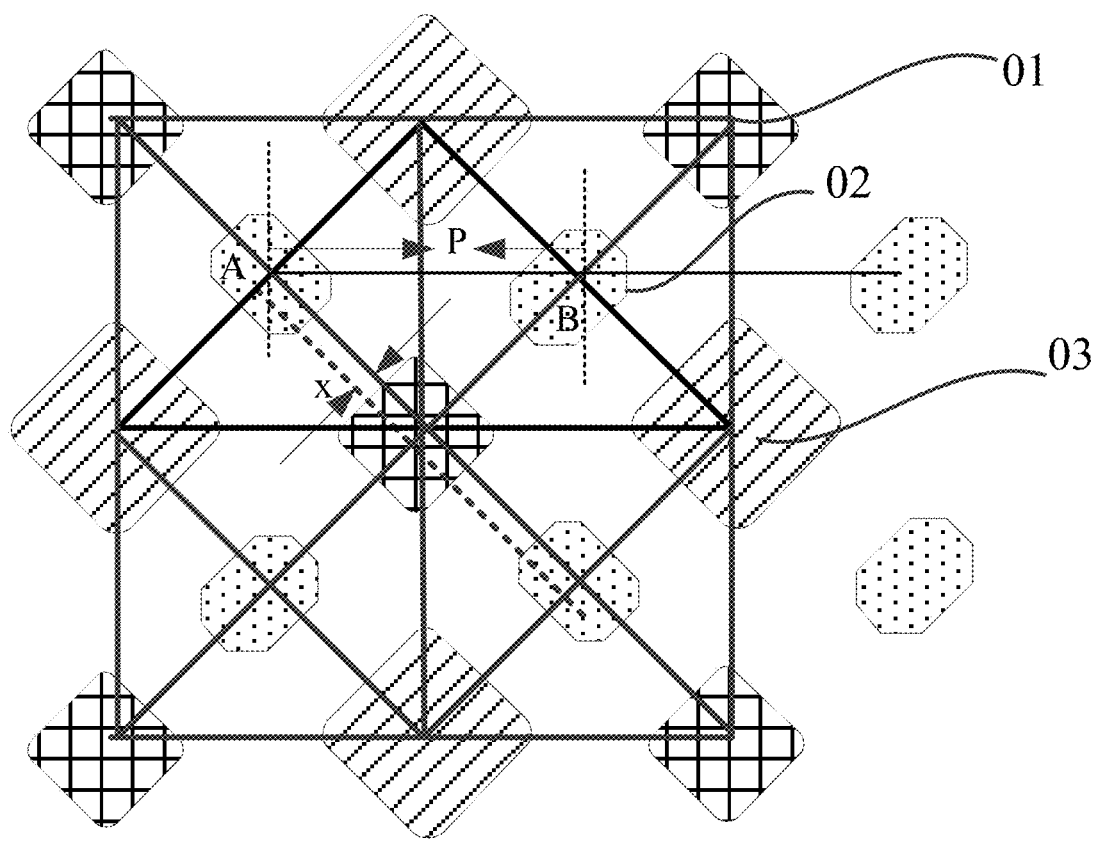

As shown in FIG. 12, the present disclosure provides in some embodiments a display substrate, which includes a plurality of first subpixels, a plurality of second subpixels and a plurality of third subpixels. In a first direction, the first subpixels and the third subpixels are arranged alternately to form a plurality of first subpixel rows, the second subpixels are arranged to form a plurality of second subpixel rows, and the first subpixel rows and the second subpixel rows are arranged alternately in a second direction. Lines connecting centers of two first subpixels and two third subpixels in two adjacent rows and two adjacent columns form a first virtual quadrilateral, the two first subpixels are arranged at two opposite vertices of the first virtual quadrilateral respectively, the two third subpixels are arranged at the other two opposite vertices of the first virtual quadrilateral respectively, and a corresponding second subpixel is located within the first virtual quadrilateral. Lines connecting centers of two second subpixels, one first subpixel and one third subpixel in adjacent three rows and adjacent three columns form a virtual parallelogram, the two second subpixels A and B are arranged at two opposite vertices of the virtual parallelogram respectively, the first subpixel and the third subpixel are arranged at the other two opposite vertices of the virtual parallelogram respectively, a line connecting the centers of the second subpixel A and the third subpixel is located on a first straight line, a distance between an orthogonal projection of the center of the first subpixel onto the first straight line and the center of the second subpixel A is x, an interior angle of the virtual parallelogram which is smaller than 90° is within a range of (h−10°, h+10°), and h is calculated through $$h = \arctan\left(\frac{x}{P}\right),$$

where P is a half of a distance between the centers of two odd-numbered or even-numbered second subpixels arranged closest to each other in each second subpixel row.

P is also a value acquired by dividing a distance between two second subpixels whose centers are located on a straight line parallel to a row direction or a column direction by k, and k is a value of the quantity of second subpixels between the two second subpixels in a same row or a same column plus 1.

P has a value within a range of 60 µm to 100 µm, and x has a value within a range of 3 µm to 5 µm.

An approximate value is acquired through the above equation, i.e., there is a certain offset for the value of the interior angle. For example, the value is fluctuated within 10° or 5° on the basis of the value of h calculated through the equation.

P is an approximate distance between the centers of two adjacent second subpixels. The second subpixels in each second subpixel row are arranged evenly, i.e., there is an approximately equal distance between any two adjacent second subpixels, or the distances between the adjacent second subpixels are different from each other, e.g., with a difference smaller than 5 µm. Here, P is also an average distance between the two adjacent second subpixels in a same subpixel row. In addition, P is also approximately equal to a distance between the center of one first subpixel in a same row and the center of the adjacent third subpixel, e.g., with a difference smaller than 5 µm. Alternatively, P is a half of a distance between the centers of two adjacent first subpixels in a same subpixel row, or a half of a distance between the centers of two adjacent third subpixels in a same subpixel row.

According to the display substrate in the embodiments of the present disclosure, as compared with a conventional display substrate, the distance between the first subpixel and the third subpixel increases in the case of an equal process condition, and the second subpixels are arranged in a staggered manner, so as to increase a distance between openings of an FMM for manufacturing the first subpixels, the second subpixels and the third subpixels in the case of a same aperture ratio, thereby to improve the manufacture allowance of the FMM and reduce the risk of crosstalk. In addition, the first subpixels, the second subpixels and the third subpixels are arranged alternately, so it is able for brightness centers to be distributed more evenly, thereby to improve a display effect of the display device.

In some embodiments of the present disclosure, the first subpixel includes a first active light-emitting region, the second subpixel includes a second active light-emitting region, and the third subpixel includes a third active light-emitting region. An area of the second active light-emitting region <an area of the first active light-emitting region <an area of the third active light-emitting region. On the display substrate, a total area of the third active light-emitting regions of the third subpixels >a total area of the second active light-emitting regions of the second subpixels >a total area of the first active light-emitting regions of the first subpixels. In some embodiments of the present disclosure, the first active light-emitting regions, the second active light-emitting regions and the third active light-emitting regions are spaced apart from each other. In some embodiments of the present disclosure, the first active light-emitting regions, the second active light-emitting regions and the third active light-emitting regions are defined by a plurality of openings spaced apart from each other in a pixel definition layer. In some embodiments of the present disclosure, each first active light-emitting region is defined by a light-emitting layer arranged between an anode and a cathode opposite to the anode in a direction perpendicular to a base substrate and driven to emit light in a corresponding first subpixel. Each second active light-emitting region is defined by a light-emitting layer arranged between an anode and a cathode opposite to the anode in the direction perpendicular to a base substrate and driven to emit light in a corresponding second subpixel. Each third active light-emitting region is defined by a light-emitting layer arranged between an anode and a cathode opposite to the anode in the direction perpendicular to a base substrate and driven to emit light in a corresponding third subpixel. In some embodiments of the present disclosure, each of the first active light-emitting regions, the second active light-emitting regions and the third active light-emitting regions is defined by a corresponding light-emitting layer and an electrode (anode or cathode) where a carrier (hole or electron) is transported or a part of the electrode. In some embodiments of the present disclosure, each of the first active light-emitting regions, the second active light-emitting regions and the third active light-emitting regions is defined by at least a part of a cathode and at least a part of an anode whose orthogonal projections onto the base substrate overlap each other and do not overlap an orthogonal projection of a first insulation layer onto the base substrate, and the first insulation layer is arranged between the cathode and the anode in the direction perpendicular to the base substrate. For example, the first insulation layer includes the pixel definition layer. In some embodiments of the present disclosure, each of the first sub-pixels, the second sub-pixels and the third sub-pixels includes a first electrode, a light-emitting layer arranged at a side of the first electrode away from the base substrate, and a second electrode arranged at a side of the light-emitting layer away from the first electrode. A second insulation layer is further arranged between the first electrode and the light-emitting layer, and/or between the second electrode and the light-emitting layer in the direction perpendicular to the base substrate. An orthogonal projection of the second insulation layer onto the base substrate overlaps an orthogonal projection of the first or second electrode onto the base substrate, and the second insulation layer is provided with an opening to expose at least a part of the first electrode or the second electrode at a side facing the light-emitting layer, so that the first electrode or the second electrode is capable of being in contact with the light-emitting layer or a functional layer assisting in the light emission. Each of the first active light-emitting regions, the second active light-emitting regions and the third active light-emitting regions is defined by a part of the first electrode or the second electrode in contact with the light-emitting layer or the functional layer. In some embodiments of the present disclosure, the second insulation layer includes the pixel definition layer. The functional layer assisting in the light emission is one or more of a hole injection layer, a hole transport layer, an electron transport layer, a hole barrier layer, an electron barrier layer, an electron injection layer, an auxiliary light-emitting layer, an interface improvement layer and an anti-reflective layer. In some embodiments of the present disclosure, the first electrode is an anode, and the second electrode is a cathode. The first electrode includes at least two layers made of Indium Tin Oxide (ITO) and argentum (Ag), e.g., three layers consisting of an ITO layer, an Ag layer and an ITO layer. The second electrode is made of one or more of Magnesium (Mg), Ag, ITO and Indium Zinc Oxide (IZO), e.g., a mixed layer or an alloy layer of Mg and Ag.

Each subpixel includes a light-emitting layer. Each first subpixel includes a first color light-emitting layer in a corresponding opening and on the pixel definition layer, each second subpixel includes a second color light-emitting layer in a corresponding opening and on the pixel definition layer, and each third subpixel includes a third color light-emitting layer in a corresponding opening and on the pixel definition layer.

Figure 1:
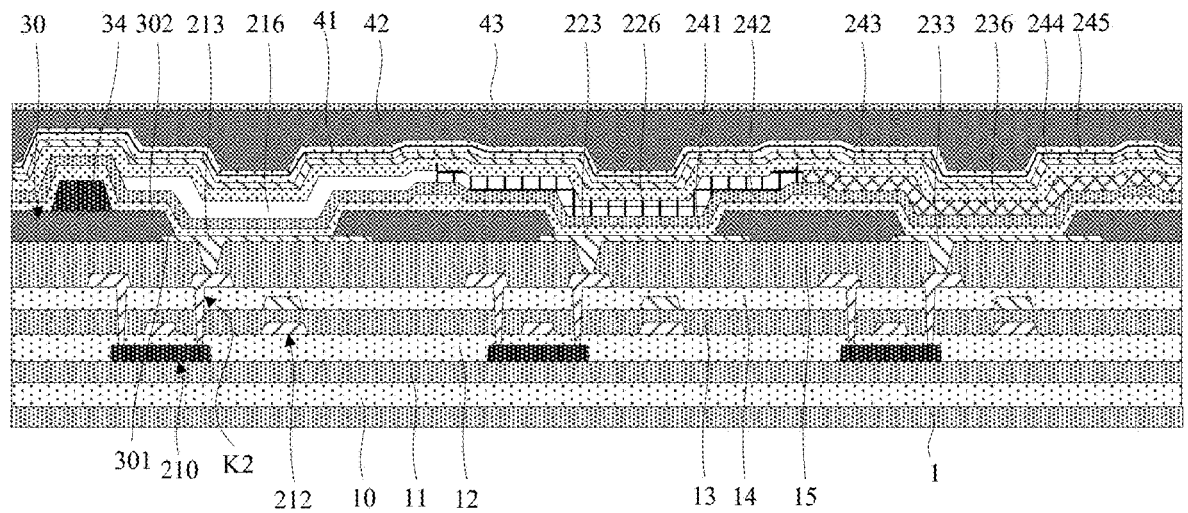
FIG. 1 is a sectional view of a display substrate according to one embodiment of the present disclosure.

In some embodiments of the present disclosure, the display substrate is manufactured through the following steps (1) to (9). The following description is given by taking a flexible display substrate with a top-emission structure in FIG. 1 as an example.

(1) A base substrate is formed on a glass support plate.

In some embodiments of the present disclosure, the base substrate 10 is a flexible base substrate. For example, the base substrate includes a first flexible material layer, a first inorganic material layer, a semiconductor layer, a second flexible material layer and a second inorganic material layer laminated one on another on the glass support plate 1. The first flexible material layer and the second flexible material layer are each made of Polyimide (PI), Polyethylene Terephthalate (PET), or a polymer soft film with surface treatment. The first inorganic material layer and the second inorganic material layer are each made of SiNx or SiOx, so as to improve the resistance to moisture and oxygen for the base substrate. The first inorganic material layer and the second inorganic material layer are also called as barrier layers. The semiconductor layer is made of amorphous silicon (a-si). In some embodiments of the present disclosure, taking a lamination structure of PI1/Barrier1/a-Si/PI2/Barrier2 as an example, its manufacture process is described as follows. At first, PI is coated onto the glass support plate 1, and cured to form the first flexible material layer (PI1). Next, a barrier thin film is deposited on the first flexible material layer to form the first barrier layer (Barrier1) covering the first flexible material layer. Next, an a-si thin film is deposited on the first barrier layer to form an a-si layer covering the first barrier layer. Next, PI is deposited on the a-si layer and cured to form the second flexible material layer (PI2). Finally, a barrier thin film is deposited on the second flexible material layer to form the second barrier layer (Barrier2) covering the second flexible material layer, thereby to acquire the base substrate 10.

(2) A driving structure layer is formed on the base substrate. The driving structure layer includes a plurality of driving circuits, and each driving circuit includes a plurality of transistors and at least one storage capacitor, e.g., the driving circuit has a 2T1C, 3T1C or 7T1C design.

In some embodiments of the present disclosure, the driving structure layer is manufactured as follows, with a driving circuit of a first subpixel 01 as an example.

A first insulation thin film and an active layer thin film are sequentially deposited on the base substrate 10, the active layer thin film is patterned through a patterning process so as to form a first insulation layer 11 covering the entire base substrate 10 as well as an active layer pattern on the first insulation layer 11, and the active layer pattern at least includes a first active layer.

Next, a second insulation thin film and a first metal thin film are sequentially deposited, the first metal thin film is patterned through a patterning process to form a second insulation layer 12 covering the active layer pattern as well as a first gate metal layer pattern on the second insulation layer 12, and the first gate metal layer pattern at least includes a first gate electrode and a first capacitor electrode.

Next, a third insulation thin film and a second metal thin film are sequentially deposited, the second metal thin film is patterned through a patterning process to form a third insulation layer 13 covering a first gate metal layer as well as a second gate metal layer pattern on the third insulation layer 13, and the second gate metal layer pattern at least includes a second capacitor electrode at a position corresponding to the first capacitor electrode.

Next, a fourth insulation thin film is deposited, and patterned through a patterning process to form a fourth insulation layer 14 covering a second gate metal layer. At least two first via-holes are formed in the fourth insulation layer 14, and the fourth insulation layer 14, the third insulation layer 13 and the second insulation layer 12 in the two via-holes are etched off to expose a surface of the first active layer.

Then, a third metal thin film is deposited, and patterned through a patterning process to form a source-drain metal layer pattern on the fourth insulation layer 14. The source-drain metal layer pattern at least includes a first source electrode and a first drain electrode arranged at a display region and coupled to the first active layer through the two first via-holes respectively.

For the driving circuit of the first subpixel 01 at the display region, the first active layer, the first gate electrode, the first source electrode and the first drain electrode form a first transistor 210, and the first capacitor electrode and the second capacitor electrode form a first storage capacitor 212. In the above-mentioned manufacture process, a driving circuit of a second subpixel 02 and a driving circuit of a third color subpixel 03 are formed simultaneously.

In some embodiments of the present disclosure, each of the first insulation layer 11, the second insulation layer 12, the third insulation layer 13 and the fourth insulation layer 14 is made of one or more of SiOx, SiNx and SiON, and has a single-layered, multi-layered or composite structure. The first insulation layer 11 is called as a buffer layer for improving the resistance to moisture and oxygen for the base substrate, the second insulation layer 12 and the third insulation layer 13 are called as Gate insulator (GI) layers, and the fourth insulation layer 14 is called an Interlayer Dielectric (ILD) layer. Each of the first metal thin film, the second metal thin film and the third metal thin film is made of a metallic material, e.g., one or more of Ag, copper (Cu), Aluminium (Al), Titanium (Ti) and Molybdenum (Mo), or an alloy thereof, e.g., AlNd or MoNb, and has a single-layered or multi-layered structure, e.g., Ti/Al/Ti. The active layer thin film is made of one or more of amorphous Indium Gallium Zinc Oxide (a-IGZO), Zinc Oxynitride (ZnON), Indium Zinc Tin Oxide (IZTO), a-Si, poly-silicon (p-Si), sexithiophene and polythiophene. In other words, the present disclosure is applied to a transistor manufactured on the basis of oxide, silicon and organics.

(3) A planarization layer formed on the base substrate with the above-mentioned patterns.

In some embodiments of the present disclosure, a flat thin film made of an organic material is coated onto the base substrate 10 with the above-mentioned patterns, so as to form the Planarization (PLN) layer 15 covering the entire base substrate 10. The planarization layer is subjected to masking, exposure and developing processes, so as to form a plurality of second via-holes K2 in the planarization layer 15 at the display region. The planarization layer 15 in the second via-holes K2 is removed to expose a surface of the first drain electrode of the first transistor 210 in the driving circuit of the first subpixel 01, a surface of a first drain electrode of a first transistor in the driving circuit of the second subpixel 02, and a surface of the first drain electrode of a first transistor in the driving circuit of the third color subpixel 03.

(4) A first electrode pattern is formed on the base substrate with the above-mentioned patterns. In some embodiments of the present disclosure, the first electrode is a reflective anode.

In some embodiments of the present disclosure, a conductive thin film is deposited onto the base substrate 10 with the above-mentioned pattern, and then patterned through a patterning process to form the first electrode pattern. A first anode 213 of the first subpixel 01 is coupled to the first drain electrode of the first transistor 210 through one second via-hole K2, a second anode 223 of the second subpixel 02 is coupled to the first drain electrode of the first transistor of the second subpixel 02 through one second via-hole K2, and a third anode 233 of the third color subpixel 03 is coupled to the first drain electrode of the first transistor of the third color subpixel 03 through one second via-hole K2.

In some embodiments of the present disclosure, the first electrode is made of a metallic material, e.g., one or more of Mg, Ag, Cu, Al, Ti and Mo, or an alloy thereof, e.g., AlNd or MoNb, and has a single-layered or multi-layered structure, e.g., Ti/Al/Ti. Alternatively, the first electrode has a stack structure made of metal and a transparent conductive material, e.g., a reflective material such as ITO/Ag/ITO or Mo/AlNd/ITO.

(5) A Pixel Definition Layer (PDL) pattern is formed on the base substrate with the above-mentioned patterns.

In some embodiments of the present disclosure, a pixel definition thin film is coated on the base substrate 10 with the above-mentioned patterns, and subjected to masking, exposure and developing processes to form the pixel definition layer pattern. The pixel definition layer 30 at the display region includes a plurality of subpixel definition members 302, and a pixel definition layer opening 301 is formed between the adjacent subpixel definition members 302. The pixel definition layer 30 in each pixel definition layer opening 301 is removed, so as to expose at least a part of a surface of the first anode 213 of the first subpixel 01, at least a part of a surface of the second anode 223 of the second subpixel 02, and at least a part of a surface of the third anode 233 of the third subpixel 03.

In some embodiments of the present disclosure, the pixel definition layer 30 is made of PI, polymethyl methacrylate, or polyethylene terephthalate.

(6) A Post Spacer (PS) pattern is formed on the base substrate with the above-mentioned patterns.

In some embodiments of the present disclosure, an organic material thin film is coated on the base substrate 10 with the above-mentioned patterns, and subjected to masking, exposure and developing processes to form a PS 34. The PS 34, as a support layer, is configured to support the FMM during the evaporation. In some embodiments of the present disclosure, one repetition unit is arranged between two adjacent PSs 34 in the row direction of the subpixels. For example, the PS 34 is arranged between the first subpixel 01 and the third color subpixel 03 adjacent to each other.

(7) An organic function layer and a second electrode are sequentially formed on the base substrate with the above-mentioned pattern. In some embodiments of the present disclosure, the second electrode is a transparent cathode. Light emitting by a light-emitting element passes through the transparent cathode and exits from a side away from the base substrate 10, so as to achieve top emission. In some embodiments of the present disclosure, the organic functional layer of the light-emitting element includes a hole injection layer, a hole transport layer, a light-emitting layer and an electron transport layer.

In some embodiments of the present disclosure, a hole injection layer 241 and a hole transport layer 242 are sequentially formed, through evaporation, on the base substrate 10 with the above-mentioned patterns using an open mask. Next, a blue light-emitting layer 236, a green light-emitting layer 216 and a red light-emitting layer 226 are sequentially formed through evaporation using the FMM. Then, an electron transport layer 243, a cathode 244 and an optical coupling layer 245 are sequentially formed through evaporation using an open mask. The hole injection layer 241, the hole transport layer 242, the electron transport layer 243 and the cathode 244 are shared by the plurality of subpixels. In some embodiments of the present disclosure, the organic functional layer further includes a micro-cavity regulation layer arranged between the hole transport layer and the light-emitting layer. For example, subsequent to the formation of the hole transport layer, a blue micro-cavity regulation layer, a blue light-emitting layer, a green micro-cavity regulation layer, a green light-emitting layer, a red micro-cavity regulation layer and a red light-emitting layer are formed sequentially through evaporation using the FMM.

In some embodiments of the present disclosure, the organic functional layer is formed at a subpixel region, so that the organic functional layer is coupled to the anode. The cathode is formed on the pixel definition layer, and coupled to the organic functional layer.

In some embodiments of the present disclosure, the cathode is made of one or more of Mg, Ag and Al, or an alloy thereof, or a transparent conductive material such as ITO, or has a multi-layered composite structure made of metal and the transparent conductive material.

In some embodiments of the present disclosure, the optical coupling layer is formed at a side of the cathode 244 away from the base substrate 10, and the optical coupling layer is shared by the plurality of subpixels. The optical coupling layer cooperates with the transparent cathode to increase an optical output. For example, the optical coupling layer is made of a semiconductor material, which will not be particularly defined herein.

(8) An encapsulation layer is formed on the base substrate with the above-mentioned patterns.

In some embodiments of the present disclosure, the encapsulation layer is formed on the base substrate 10 with the above-mentioned patterns. The encapsulation layer includes a first encapsulation layer 41, a second encapsulation layer 42 and a third encapsulation layer 43 laminated one on another. The first encapsulation layer 41 is made of an inorganic material and covers the cathode 244 at the display region. The second encapsulation layer 42 is made of an organic material. The third encapsulation layer 43 is made of an inorganic material, and covers the first encapsulation layer 41 and the second encapsulation layer 42. However, the structure of the encapsulation layer will not be particularly defined herein. In some embodiments of the present disclosure, the encapsulation layer includes five layers, i.e., it has a structure of inorganic layer/organic layer/inorganic layer/organic layer/inorganic layer.

In some embodiments of the present disclosure, x is within a range of 3 μm to 5 μm, e.g., 3 μm, 3.5 μm, 4 μm, 4.5 μm or 5 μm.

In some embodiments of the present disclosure, the interior angle is greater than or equal to 70° and smaller than 90°. Further, the interior angle is greater than or equal to 75° and not equal to 90°.

In some embodiments of the present disclosure, a line connecting the centers of the first subpixel and the third subpixel adjacent to each other in the first direction is angled relative to the first direction by an angle d, a line connecting the centers of the first subpixel and the third subpixel adjacent to each other in the second direction is angled relative to the second direction by an angle e, the angle d is greater than 0° and not equal to 90°, and the angle e is greater than 0° and not equal to 90°.

Further, d is within a range of 0° to 30°, or 0° to 20°, or 0° to 10°, or 0° to 5°, e.g., 1°, 2°, 3° or 4°, and e is within a range of 0° to 30°, or 0° to 20°, or 0° to 10°, or 0° to 5°, e.g., 1°, 2°, 3° or 4°.

In some embodiments of the present disclosure, the first direction is perpendicular to the second direction, the first direction is one of a row direction and a column direction, and the second direction is the other one of the row direction and the column direction.

In some embodiments of the present disclosure, four first virtual quadrilaterals in two columns and two rows are arranged in such a manner as to share common sides to form a second virtual polygon, and the second virtual polygon includes four second subpixels, five first subpixels and four third subpixels. The four second subpixels are located within the four first virtual quadrilaterals respectively, one first subpixel is surrounded by the four second subpixels, the other four first subpixels and the four third subpixels are arranged at sides or vertices of the second virtual polygon respectively, and the four first subpixels and the four third subpixels at the sides or vertices of the second virtual polygon are arranged alternately in a clockwise direction and a counterclockwise direction along the sides of the second virtual polygon. Lines connecting the centers of the four first subpixels at the sides or vertices of the second virtual polygon approximately form a virtual parallelogram, and/or lines connecting the centers of the four third subpixels at the sides or vertices of the second virtual polygon approximately form a virtual parallelogram.

The second virtual polygon is a concave polygon (with an angle with a measure that is between 180 degrees and 360 degrees exclusive) or a convex polygon (all interior angles are less than 180 degrees). When the first virtual quadrilaterals are arranged in such a manner as to share common sides to form the second virtual polygon, it means that two first virtual quadrilaterals adjacent to each other in the row direction share one side in the column direction, and two first virtual quadrilaterals adjacent to each other in the column direction share one side in the row direction.

In some embodiments of the present disclosure, the second virtual polygon is a concave octagon, and the four first subpixels and the four third subpixels are arranged at eight vertices of the concave octagon.

In some embodiments of the present disclosure, a line connecting centers of at least a part of the first subpixels is approximately located on a third straight line, a line connecting centers of at least a part of the third subpixels is approximately located on a fourth straight line, and the third straight line is approximately parallel to the fourth straight line.

In some embodiments of the present disclosure, the third straight line and the fourth straight line do not coincide with each other, and are approximately parallel to the first direction or the second direction.

In some embodiments of the present disclosure, a line connecting the centers of at least a part of the second subpixels in a same second pixel row is approximately located on a fifth straight line approximately parallel to the third straight line and the fourth straight line.

In some embodiments of the present disclosure, a line connecting the centers of the second subpixels adjacent to each other in the first direction is angled relative to the first direction by an angle f, a line connecting the centers of the second subpixels adjacent to each other in the second direction is angled relative to the second direction by an angle g, the angle f is greater than 0° and smaller than 30°, and the angle g is greater than 0° and smaller than 30°.

Further, f is within a range of 0° to 30°, or 0° to 20°, or 0° to 10°, or 0° to 5°, e.g., 1°, 2°, 3° or 4°, and g is within a range of 0° to 30°, or 0° to 20°, or 0° to 10°, or 0° to 5°, e.g., 1°, 2°, 3° or 4°.

In some embodiments of the present disclosure, four third subpixels are arranged adjacent to each first subpixel, and distances between the center of the first subpixel and the centers of at least two of the four third subpixels are different from each other. Four first subpixels are arranged adjacent to each third subpixel, and distances between the center of the third subpixel and the centers of at least two of the four first subpixels are different from each other.

In some embodiments of the present disclosure, the display substrate includes a plurality of pixel repetition units. Each pixel repetition unit includes two first subpixels and two third subpixels belonging to a same first virtual quadrilateral, and further includes four second subpixels belonging to a same second virtual polygon as one of the two first subpixels and surrounding the first subpixel.

In addition, the pixel repetition unit at an edge of the display substrate probably has a structure different from a structure of the pixel repetition unit within the display substrate, and a part of the subpixels in the pixel repetition unit at the edge of the display substrate are probably missed.

In some embodiments of the present disclosure, each second subpixel is of an octagonal shape.

In a possible embodiment of the present disclosure, the first subpixels have a same area, so as to provide the first subpixels with a same light-emitting area in any light-emitting pixel point consisting of the first subpixel, the second subpixel and the third subpixel.

Of course, during the implementation, at least two first subpixels have different areas, which will not be particularly defined herein.

In a possible embodiment of the present disclosure, the second subpixels have a same area, so as to provide the second subpixels with a same light-emitting area in any light-emitting pixel point consisting of the first subpixel, the second subpixel and the third subpixel.

Of course, during the implementation, at least two second subpixels have different areas, which will not be particularly defined herein.

In a possible embodiment of the present disclosure, the third subpixels have a same area, so as to provide the third subpixels with a same light-emitting area in any light-emitting pixel point consisting of the first subpixel, the second subpixel and the third subpixel.

Of course, during the implementation, at least two third subpixels have different areas, which will not be particularly defined herein.

In some embodiments of the present disclosure, each first subpixel has an area of S, each second subpixel has an area of f*S, and each third subpixel has an area of g*S, where $0.5 \leq f \leq 0.8$ and $1 \leq g \leq 2.2$. In this way, it is able for the brightness centers in the light-emitting pixel points each consisting of the first subpixel, the second subpixel and the third subpixel to be distributed more evenly, thereby to improve a display effect.

Further, a blue subpixel has low luminous efficiency as well as a short service life. Hence, in a possible embodiment of the present disclosure, an area of the blue subpixel is designed to be greater than an area of a red subpixel and an area of a green subpixel.

Further, usually the green subpixel has relatively high luminous efficiency, so the area of the green subpixel is set to be smaller than the area of the red subpixel. Of course, during the implementation, the area of the green subpixel is also same to that of the red subpixel, which will not be particularly defined herein.

In order to provide a same mask pattern for a same kind of subpixels during the manufacture, thereby to simplify a patterning process, in a possible embodiment of the present disclosure, the first subpixels have an approximately same shape.

Of course, during the implementation, at least two first subpixels have different shapes, which will not be particularly defined herein.

In order to provide a same mask pattern for a same kind of subpixels during the manufacture, thereby to simplify a patterning process, in a possible embodiment of the present disclosure, the second subpixels have an approximately same shape.

Of course, during the implementation, at least two second subpixels have different shapes, which will not be particularly defined herein.

In a possible embodiment of the present disclosure, in one second virtual parallelogram, when the four second subpixels have a same or similar pattern, arrangement angles of these second subpixels are the same, or an arrangement angle of each second subpixel is rotated randomly, which will not be particularly defined herein.

In order to provide a same mask pattern for a same kind of subpixels during the manufacture, thereby to simplify a patterning process, in a possible embodiment of the present disclosure, the third subpixels have an approximately same shape.

Of course, during the implementation, at least two third subpixels have different shapes, which will not be particularly defined herein.

In a possible embodiment of the present disclosure, specific shapes of the second subpixels, the first subpixels and the third subpixels as well as a position relationship, a parallel relationship and an angular relationship among them are designed according to the practical need. In actual use, due to the constraints of a process condition or any other factors, there exists a certain offset. Hence, the display substrate in the embodiments of the present disclosure is provided as long as the shapes and the positions of the subpixels as well as the relative position relationship among them have approximately met the above-mentioned conditions.

It should be appreciated that, when the subpixels have different patterns, it means that the subpixels have different shapes, e.g., one subpixel is circular and the other is rectangular. When the subpixels have a same pattern, it means that the subpixels have a same or similar shape, e.g., when two subpixels are triangular, they are considered to have a same shape regardless of the areas.

In some embodiments of the present disclosure, each of the first subpixels and the third subpixels has a shape of polygon, circle or oval.

In some embodiments of the present disclosure, each of the first subpixels and the third subpixels has a shape of quadrilateral, hexagon, octagon, quadrilateral with rounded angles, hexagon with rounded angles, octagon with rounded angles, circle or oval.

In a possible embodiment of the present disclosure, the first subpixel is a red subpixel, the third subpixel is a blue subpixel and the second subpixel is a green subpixel; or the first subpixel is a blue subpixel, the third subpixel is a red subpixel and the second subpixel is a green subpixel. In this way, the green subpixel within the first virtual quadrilateral forms one light-emitting pixel point with the red subpixel and the blue subpixel at any two adjacent vertices of the first virtual quadrilateral.

In another possible embodiment of the present disclosure, the first subpixel is a green subpixel, the third subpixel is a red subpixel and the second subpixel is a blue subpixel; or the first subpixel is a green subpixel, the third subpixel is a blue subpixel and the second subpixel is a red subpixel.

It should be appreciated that, when the subpixel is located at a certain position, it means that a range of the position of the subpixel is provided, as long as the subpixel overlaps the position. During the implementation, the center of the subpixel coincides with the position. Of course, the center of the subpixel may do not coincide with the position, i.e., there is an offset between them, which will not be particularly defined herein. In addition, the center of the subpixel is a geometric center of the subpixel pattern, or a color center of the subpixel, which will not be particularly defined herein.

In a possible embodiment of the present disclosure, in order to ensure that the subpixels are distributed evenly, the centers of the subpixels are arranged in such a manner as to be close to the corresponding positions as possible.

Figure 2:
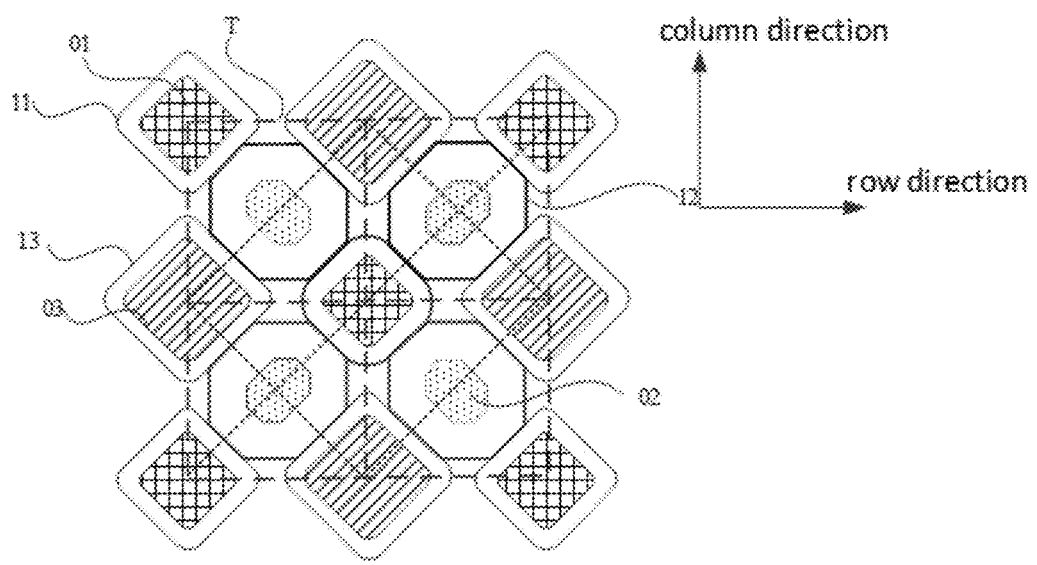
FIGS. 2, 3 and 6 are schematic views showing a conventional display substrate.

As shown in FIG. 2, in a conventional display substrate, first subpixels 01 and third subpixels 03 are arranged alternately to form a plurality of first subpixel rows, second subpixels 02 form a plurality of second subpixel rows, and the first subpixel rows and the second subpixel rows are arranged alternately in a column direction. Lines connecting centers of two first subpixels 01 and two third subpixels 03 in two adjacent rows and two adjacent columns form a first virtual quadrilateral T (a small dotted box in FIG. 2). The two first subpixels 01 are arranged at two opposite vertices of the first virtual quadrilateral T, the two third subpixels 03 are arranged at the other two opposite vertices of the first virtual quadrilateral T, and one second subpixel 02 is arranged within the first virtual quadrilateral T. A center of the second subpixel 02 coincides with, or does not coincide with, a center of the first virtual quadrilateral T.

Figure 3:
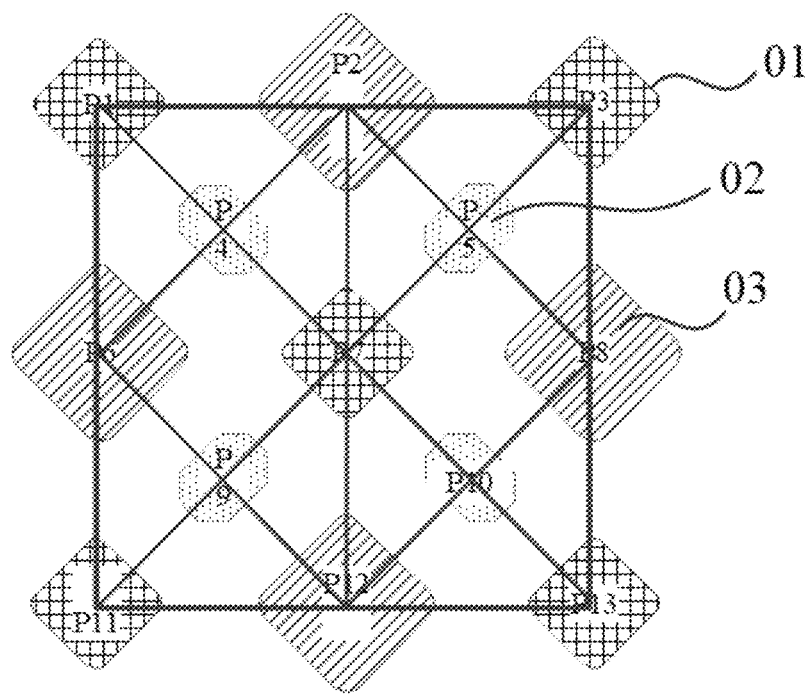

As shown in FIGS. 2 and 3, in the first virtual quadrilateral T, a line connecting the centers of the first subpixel 01 and the third subpixel 03 adjacent to each other in the column direction is parallel to the column direction, and a line connecting the centers of the first subpixel 01 and the third subpixel 03 adjacent to each other in the row direction is parallel to the row direction. As shown in FIG. 3, lines connecting the centers of two second subpixels, one first subpixel and one third subpixels in adjacent three rows and adjacent three columns form a rectangle. For example, lines connecting centers of subpixels P2, P4, P7 and P5 form a rectangle, lines connecting centers of subpixels P9, P6, P4 and P7 form a rectangle, lines connecting centers of subpixels P10, P7, P5 and P8 form a rectangle, lines connecting centers of subpixels P9, P7, P10 and P12 form a rectangle. A line connecting the centers of the subpixels P2, P4 and P6 is located on a straight line, a line connecting the centers of the subpixels P3, P5, P7, P9 and P11 is located on a straight line, a line connecting the centers of the subpixels P8, P10 and P12 is located on a straight line, a line connecting the centers of the subpixels P2, P5 and P8 is located on a straight line, a line connecting the centers of the subpixels P1, P4, P7, P10 and P13 is located on a straight line, and a line connecting the centers of the subpixels P6, P9 and P12 is located on a straight line.

Figure 4:
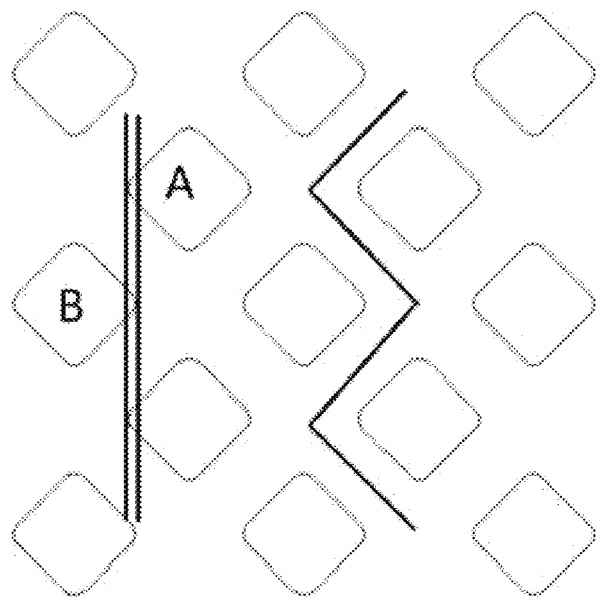
FIG. 4 is a schematic view showing openings of a conventional FMM.

11 represents an opening of the FMM corresponding to the first subpixel 01, 12 represents an opening of the FMM corresponding to the second subpixel 02, and 13 represents an opening of the FMM corresponding to the third subpixel 03. Taking the third subpixel 03 as an example, FIG. 4 shows the openings of the FMM. As shown in FIG. 4, boundaries of adjacent openings (e.g., A and B) overlap each other. When the FMM is expanded longitudinally, a tensile force is merely delivered through a material of the FMM along a folded line in FIG. 4. At this time, an uneven force is applied to the FMM, and it is difficult to expand the FMM. Hence, there is an offset during the expansion and thereby such a defect as crosstalk occurs. The same situation also occurs for the FMM for manufacturing the first subpixel 01.

Figure 5:
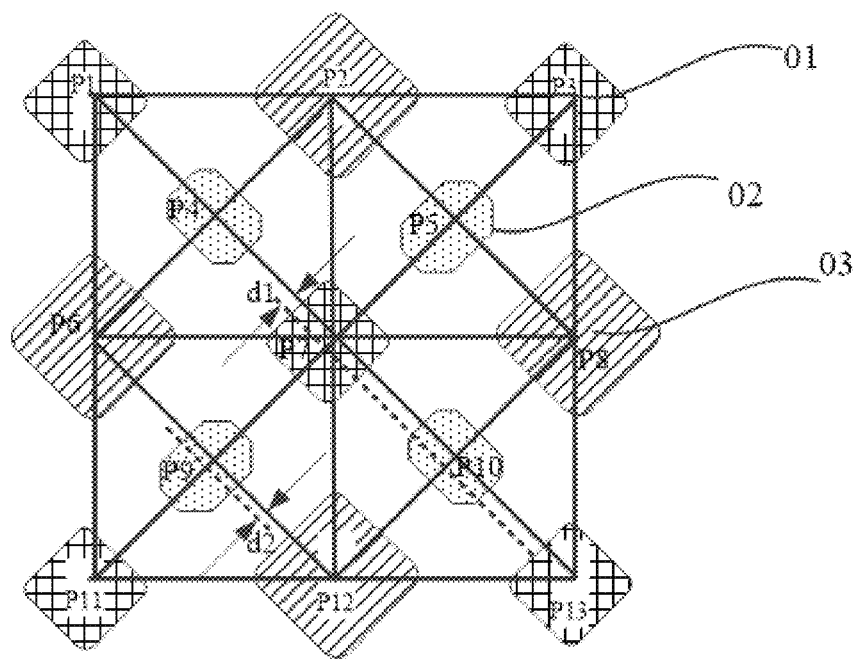
FIGS. 5, 7, 8 and 9 are schematic views showing the display substrate according to one embodiment of the present disclosure.

In the embodiments of the present disclosure, in order to prevent the occurrence of crosstalk, the relative position relationship among the subpixels is changed. As shown in FIG. 5, a line connecting the centers of the subpixels P2, P4 and P6 extends in a third direction, and a plurality of fourth subpixel columns is arranged sequentially in the third direction. For example, the subpixels P3, P5, P7, P9 and P11 are arranged in one fourth subpixel column, the subpixels P2, P4 and P6 are arranged in another fourth subpixel column, and the subpixels P8, P10 and P12 are arranged in yet another fourth subpixel column. In the third direction, the centers of the subpixels in a same fourth subpixel column are located on a same straight line. In a fourth direction perpendicular to the third direction, the centers of the subpixels in two adjacent fourth subpixel columns are not located on a same straight line, but spaced apart from each other by a certain distance. For example, the center of the subpixel P7 is spaced apart from the center of the subpixel P10 by d1 in the fourth direction, the center of the subpixel P7 is spaced apart from the center of the subpixel P4 by d1 in the fourth direction, the center of the subpixel P9 is spaced apart from the center of the subpixel P6 by d2 in the fourth direction, and the center of the subpixel P9 is spaced apart from the center of the subpixel P12 by d2 in the fourth direction. The corresponding subpixels are approximately located on a same straight line in the third direction. The subpixel P9 corresponds to the subpixels P6 and P12, the subpixel P7 corresponds to the subpixels P4 and P10, and d1 is the same to d2. Meanwhile, the centers of the subpixels in the odd-numbered fourth subpixel columns, i.e., a first one of the fourth subpixel columns, a third one of the fourth subpixel columns, a fifth one of the fourth subpixel columns, . . . , and a $(2m+1)^{th}$ one of the fourth subpixel columns, are located on a same straight line in the fourth direction, and the centers of the subpixels in the even-numbered fourth subpixel columns, i.e., a second one of the fourth subpixel columns, a fourth one of the fourth subpixel columns, a sixth one of the fourth subpixel columns, . . . , and a $(2m)^{th}$ one of the fourth subpixel columns, are located on a same straight line in the fourth direction, where m is a positive integer. In other words, the center of the subpixel P7 is aligned with, i.e., located on a same straight line as, the centers of the subpixels PI and P13 in the fourth direction, the center of the subpixel P2 is aligned with the center of the subpixel P8 in the fourth direction, the center of the subpixel P6 is aligned with the center of the subpixel P12 in the fourth direction, the center of the subpixel P4 is aligned with the center of the subpixel P10 in the fourth direction, and so on.

Lines connecting the centers of the four adjacent first subpixels, i.e., P1, P3, P11 and P13, form a rectangle or square, and lines connecting the centers of the four adjacent third subpixels, i.e., P2, P6, P12 and P8, form a rectangle or square.

Lines connecting the centers of two second subpixels, one first subpixel and one third subpixel in adjacent three rows and adjacent three columns form a virtual parallelogram. For example, lines connecting the centers of the subpixels P2, P4, P7 and P5 form a virtual parallelogram, lines connecting the centers of the subpixels P9, P6, P4 and P7 form a virtual parallelogram, lines connecting the centers of the subpixels P10, P7, P5 and P8 form a virtual parallelogram, and lines connecting the centers of the subpixels P9, P7, P10 and P12 form a virtual parallelogram.

In the virtual parallelogram consisting of the lines connecting the centers of the subpixels P9, P7, P10 and P12, a line connecting the centers of the subpixels P10 and P12 is located on a first straight line parallel to the third direction, and a distance between an orthogonal projection of the center of the subpixel P7 onto the first straight line and the center of the subpixel 10 is d1. An interior angle of the virtual parallelogram which is smaller than 90° is within a range of (h−10°, h+10°), and h is calculated through $$h = \arctan\left(\frac{x}{P}\right),$$

where P is a half of a distance between the centers of two odd-numbered or even-numbered second subpixels arranged closest to each other in each second subpixel row, e.g., a half of a distance between the centers of a first one of the second subpixels and a third one of the second subpixels, or a half of a distance between the centers of a sixth one of the second subpixels and an eighth one of the second subpixels.

An approximate value is acquired through the above equation, i.e., there is a certain offset for the value of the interior angle. For example, the value is fluctuated within 10° or 5° on the basis of the value of h calculated through the equation.

Figure 6:
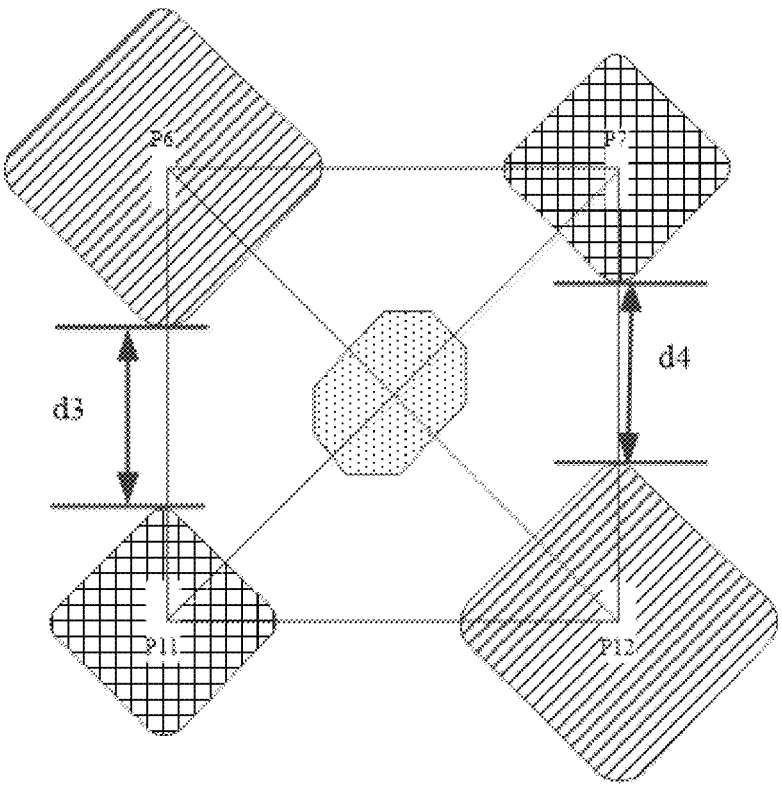
Figure 7:
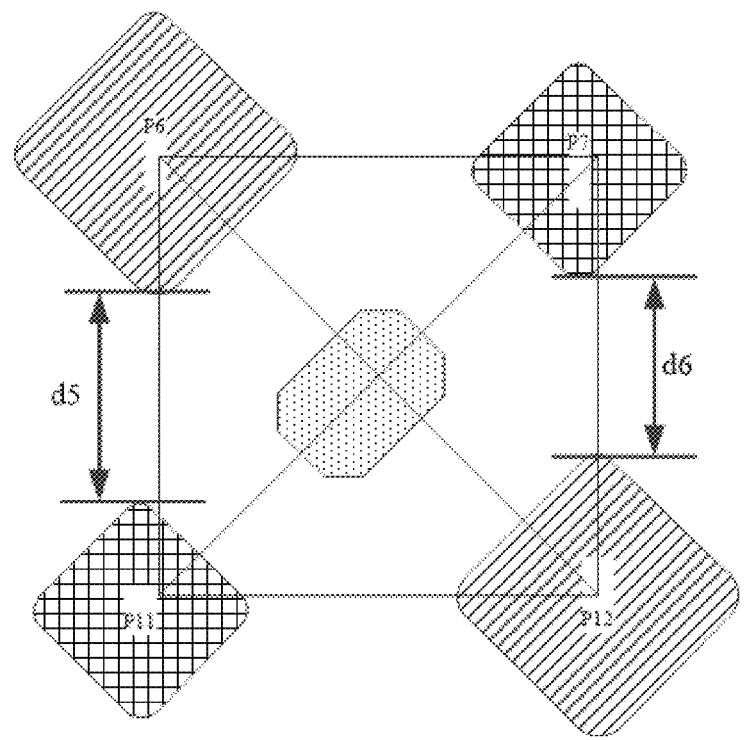

Through the above-mentioned arrangement mode, it is able to adjust a position of the first subpixel 01 relative to the third subpixel 03, thereby to appropriately increase the distance between the first subpixel 01 and the third subpixel 03. As shown in FIG. 6, when an arrangement mode in FIG. 3 is adopted, a distance between the subpixels P6 and P11 is d3, a distance between the subpixels P7 and P12 is d4, d3 is equal to d4 and it is 24 µm. As shown in FIG. 7, when the arrangement mode in FIG. 5 is adopted, a distance between the subpixels P6 and P11 is d5, a distance between the subpixels P7 and P12 is d6, d5 is greater than d6. When d1 and d2 are each 3 µm, d5 increases to 27 µm, and d6 is still 24 µm. In this way, it is able to increase the distance between a part of the first subpixels and the third subpixels adjacent to each other. Similarly, it is able to increase the distance between a part of the second subpixels adjacent to each other. As a result, it is able to increase the distance between the openings of the FMM for forming the first subpixels, increase the distance between the openings of the FMM for forming the second subpixels, and increase the distance between the openings of the FMM for forming the third subpixels, thereby to improve the manufacture allowance of the FMM and reduce the risk of crosstalk.

Figure 8:
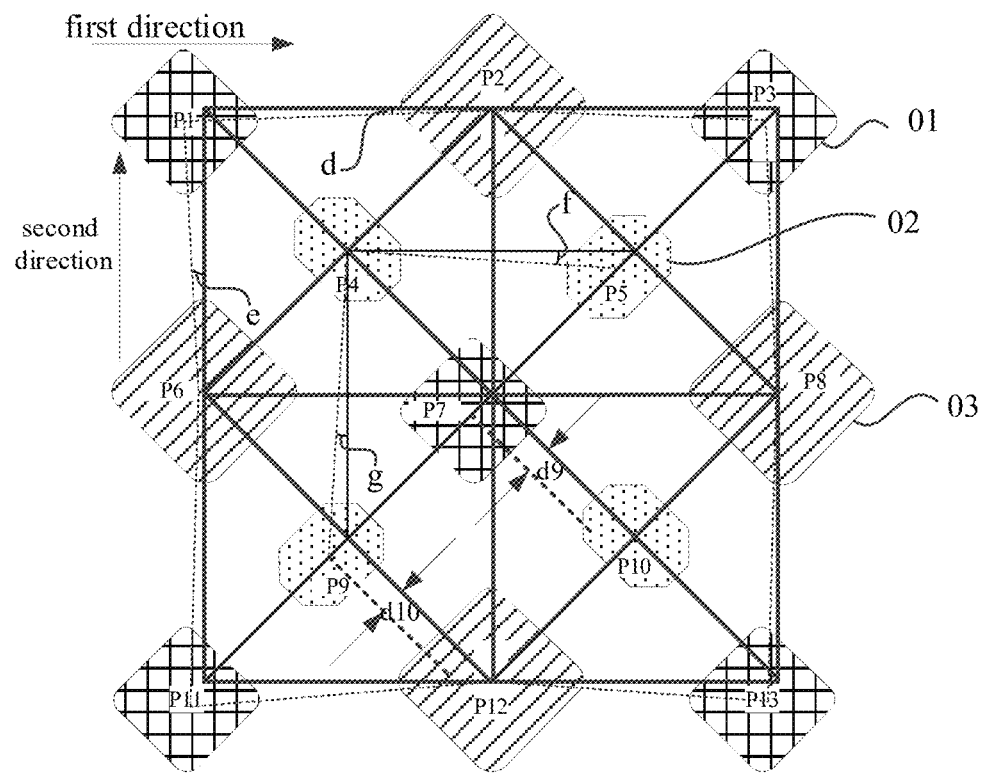

As shown in FIG. 8, a line connecting the centers of the subpixels P2, P4 and P6 extends in a third direction, and a plurality of fourth subpixel columns is arranged sequentially in the third direction. For example, the subpixels P3, P5, P7, P9 and P11 are arranged in one fourth subpixel column, the subpixels P2, P4 and P6 are arranged in another fourth subpixel column, and the subpixels P8, P10 and P12 are arranged in yet another fourth subpixel column. In the third direction, the centers of the subpixels in a same fourth subpixel column are located on a same straight line. In a fourth direction perpendicular to the third direction, the centers of the subpixels in two adjacent fourth subpixel columns are not located on a same straight line, but spaced apart from each other by a certain distance. For example, the center of the subpixel P7 is spaced apart from the center of the subpixel P10 by d9 in the third direction, the center of the subpixel P7 is spaced apart from the center of the subpixel P4 by d9 in the third direction, the center of the subpixel P9 is spaced apart from the center of the subpixel P6 by d10 in the third direction, and the center of the subpixel P9 is spaced apart from the center of the subpixel P12 by d10 in the third direction. The corresponding subpixels are approximately located on a same straight line in the third direction. The subpixel P9 corresponds to the subpixels P6 and P12, the subpixel P7 corresponds to the subpixels P4 and P10, and d9 is same to d10. Meanwhile, the centers of the subpixels in the odd-numbered fourth subpixel columns, i.e., a first one of the fourth subpixel columns, a third one of the fourth subpixel columns, a fifth one of the fourth subpixel columns, . . . , and a $(2m+1)^{th}$ one of the fourth subpixel columns, are located on a same straight line in the fourth direction, and the centers of the subpixels in the even-numbered fourth subpixel columns, i.e., a second one of the fourth subpixel columns, a fourth one of the fourth subpixel columns, a sixth one of the fourth subpixel columns, . . . , and a $(2m)^{th}$ one of the fourth subpixel columns, are located on a same straight line in the fourth direction, where m is a positive integer. In other words, the center of the subpixel P7 is aligned with, i.e., located on a same straight line as, the centers of the subpixels P1 and P13 in the fourth direction, the center of the subpixel P2 is aligned with the center of the subpixel P8 in the fourth direction, the center of the subpixel P6 is aligned with the center of the subpixel P12 in the fourth direction, the center of the subpixel P4 is aligned with the center of the subpixel P10 in the fourth direction, and so on.

Lines connecting the centers of the four adjacent first subpixels, i.e., P1, P3, P11 and P13, form a rectangle or square, and lines connecting the centers of the four adjacent third subpixels, i.e., P2, P6, P12 and P8, form a rectangle or square.

Lines connecting the centers of two second subpixels, one first subpixel and one third subpixel in adjacent three rows and adjacent three columns form a virtual parallelogram. For example, lines connecting the centers of the subpixels P2, P4, P7 and P5 form a virtual parallelogram, lines connecting the centers of the subpixels P9, P6, P4 and P7 form a virtual parallelogram, lines connecting the centers of the subpixels P10, P7, P5 and P8 form a virtual parallelogram, and lines connecting the centers of the subpixels P9, P7, P10 and P12 form a virtual parallelogram.

In the virtual parallelogram consisting of the lines connecting the centers of the subpixels P9, P7, P10 and P12, a line connecting the centers of the subpixels P10 and P12 is located on a first straight line parallel to the third direction, and a distance between an orthogonal projection of the center of the subpixel P7 onto the first straight line and the center of the subpixel 10 is d9. An interior angle of the virtual parallelogram which is smaller than 90° is within a range of (h−10°, h+10°), and h is calculated through $$h = \arctan\left(\frac{x}{P}\right),$$

where P is a half of a distance between the centers of two odd-numbered or even-numbered second subpixels arranged closest to each other in each second subpixel row, e.g., a half of a distance between the centers of a first one of the second subpixels and a third one of the second subpixels, or a half of a distance between the centers of a sixth one of the second subpixels and an eighth one of the second subpixels.

An approximate value is acquired through the above equation, i.e., there is a certain offset for the value of the interior angle. For example, the value is fluctuated within 10° or 5° on the basis of the value of h calculated through the equation.

Figure 9:
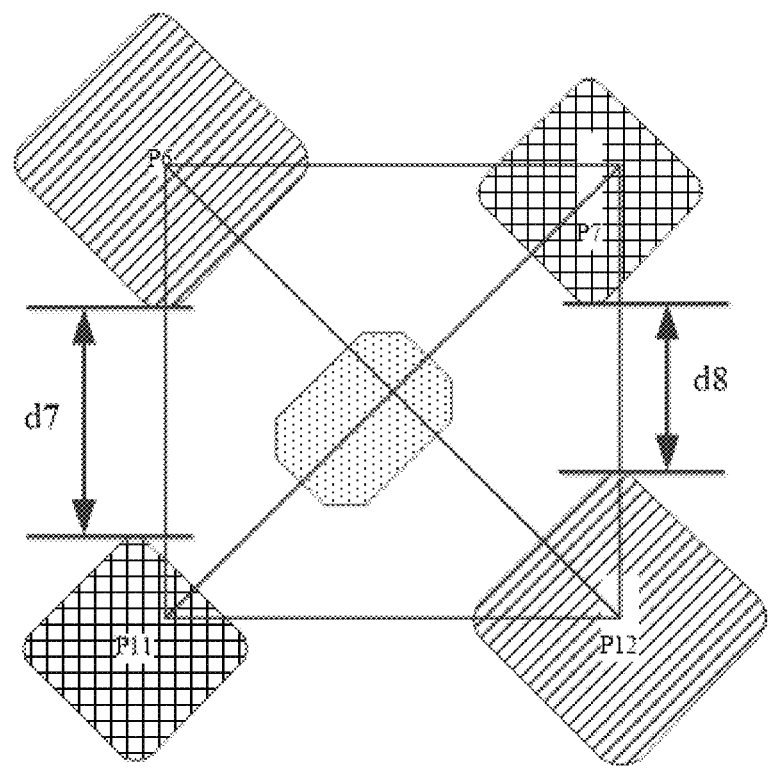

Through the above-mentioned arrangement mode, it is able to adjust a position of the first subpixel 01 relative to the third subpixel 03, thereby to appropriately increase the distance between the first subpixel 01 and the third subpixel 03. As shown in FIG. 6, when an arrangement mode in FIG. 3 is adopted, a distance between the subpixels P6 and P11 is d3, a distance between the subpixels P7 and P12 is d4, d3 is equal to d4 and it is 24 µm. As shown in FIG. 9, when the arrangement mode in FIG. 8 is adopted, a distance between the subpixels P6 and P11 is d7, a distance between the subpixels P7 and P12 is d8, d7 is greater than d8. When d9 and d10 are each 5 µm, d7 increases to 29 µm, and d8 is 23.8 µm which is slightly smaller than 24 µm. In this way, it is able to increase the distance between a part of the first subpixels and the third subpixels adjacent to each other. Identically, it is able to increase the distance between a part of the second subpixels adjacent to each other. As a result, it is able to increase the distance between the openings of the FMM for forming the first subpixels, increase the distance between the openings of the FMM for forming the second subpixels, and increase the distance between the openings of the FMM for forming the third subpixels, thereby to improve the manufacture allowance of the FMM and reduce the risk of crosstalk.

The subpixels P1 to P13 form a second virtual polygon, a line connecting the centers of the subpixels P1 and P2 is angled relative to the first direction by an angle d, a line connecting the centers of the subpixels P1 and P6 is angled relative to the second direction by an angle e, the angle d is greater than 0° and smaller than 30°, and the angle e is greater than 0° and smaller than 30°.

A line connecting the centers of the subpixels P4 and P5 is angled relative to the first direction by an angle f, a line connecting the centers of the subpixels P4 and P9 is angled relative to the second direction by an angle g, the angle f is greater than 0° and smaller than 30°, and the angle g is greater than 0° and smaller than 30°.

In some embodiments of the present disclosure, a plurality of fifth subpixel columns is sequentially arranged in the fourth direction. For example, the subpixels P1, P4, P7, P10 and P13 are arranged in one fifth subpixel column, the subpixels P2, P5 and P8 are arranged in another fifth subpixel column, and the subpixels P6, P9 and P12 are arranged in yet another fifth subpixel column. In the fourth direction, the centers of the subpixels in a same fifth subpixel column are located on a same straight line. The centers of the subpixels in two adjacent fifth subpixel columns are not located on a same straight line, but spaced apart from each other by a certain distance. Meanwhile, the centers of the subpixels in the odd-numbered fifth subpixel columns, i.e., a first one of the fifth subpixel columns, a third one of the fifth subpixel columns, a fifth one of the fifth subpixel columns, . . . , and a $(2m+1)^{th}$ one of the fifth subpixel columns, are located on a same straight line in the third direction, and the centers of the subpixels in the even-numbered fourth subpixel columns, i.e., a second one of the fifth subpixel columns, a fourth one of the fifth subpixel columns, a sixth one of the fifth subpixel columns, . . . , and a $(2m)^{th}$ one of the fifth subpixel columns, are located on a same straight line in the fourth direction, where m is a positive integer. In this way, it is able to increase the distance between a part of the first subpixels and the third subpixels adjacent to each other. Identically, it is able to increase the distance between a part of the second subpixels adjacent to each other. As a result, it is able to increase the distance between the openings of the FMM for forming the first subpixels, increase the distance between the openings of the FMM for forming the second subpixels, and increase the distance between the openings of the FMM for forming the third subpixels, thereby to improve the manufacture allowance of the FMM and reduce the risk of crosstalk.

Figure 10:
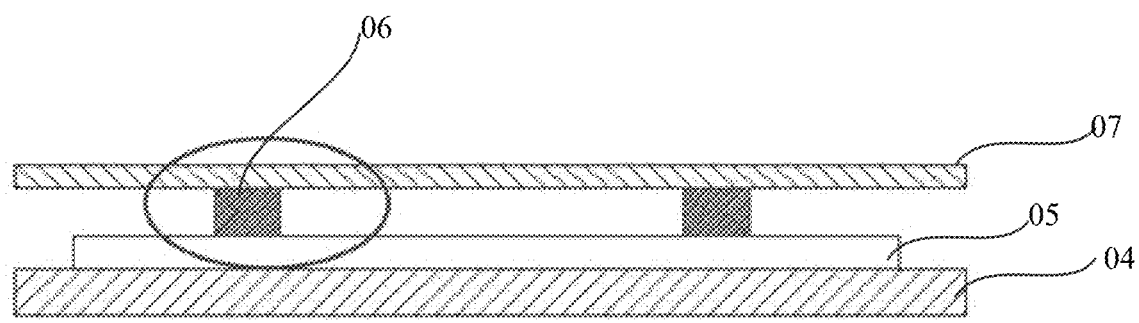
FIG. 10 is a schematic view showing the evaporation through an FMM according to one embodiment of the present disclosure.

In addition, as shown in FIG. 10, during the evaporation, an FMM 07 is arranged close to a display structure 05 on a base substrate 04, and the display structure 05 includes a TFT, an electrode, etc. In order to prevent the FMM 07 from scraping the display structure 05 on the base substrate 04, a spacer 06 is arranged on the base substrate 04 so as to support the FMM 07 on the base substrate 04 and protect the display structure 05. However, the spacer 06 is required to be arranged at an appropriate position so as to prevent a normal display effect from being adversely affected.

Figure 11:
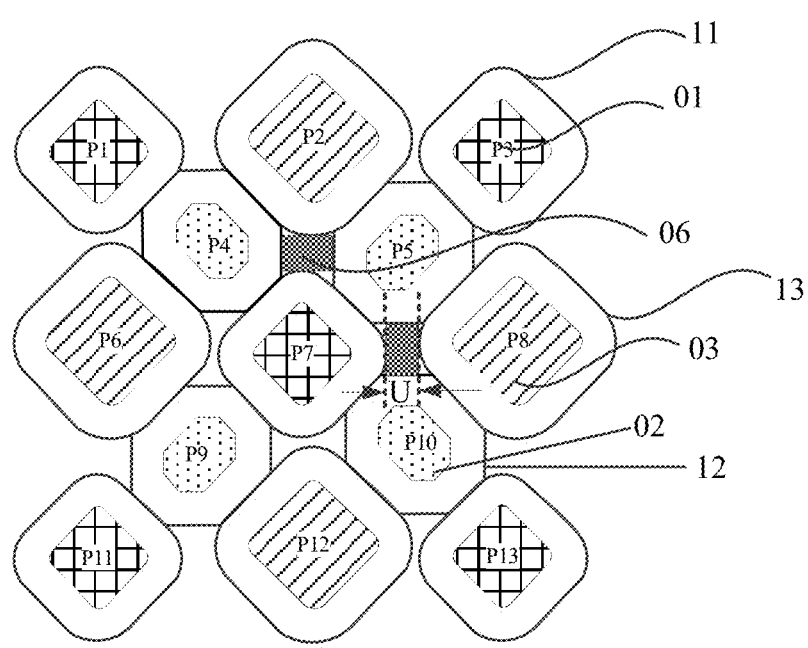
FIG. 11 is a schematic view

When the display structure 05 is scraped by the FMM 07 during the evaporation, a display defect occurs due to the aggregation of the display structures 05. In the embodiments of the present disclosure, as shown in FIGS. 2, 3, 5 and 8, the second subpixel 02 is of an octagonal shape. In this way, as shown in FIG. 11, the two second subpixels 02 adjacent to each other in the first direction are spaced apart from each other by a certain distance in the first direction, and the two second subpixels 02 adjacent to each other in the second direction are spaced apart from each other by a certain distance, so as to receive the spacer 06 without adversely affecting the display effect. In addition, it is able to support the FMM 07, thereby to prevent the defect caused by a foreign matter. Of course, the second subpixel 02 is not limited to be of an octagonal shape, i.e., it may be of any other shape, as long as the adjacent second subpixels 02 are spaced apart from each other by a certain distance.

Based on a same inventive concept, the present disclosure further provides in some embodiment an electroluminescent display panel including the above-mentioned display substrate. Adjacent first virtual quadrilaterals are arranged in a row direction and a column direction in such a manner as to share sides, i.e., two adjacent display substrates share the first subpixel 01 and the third subpixel 03 at a common side of the adjacent first virtual quadrilaterals. A principle of the electroluminescent display panel for solving the problem is similar to that of the display substrate mentioned hereinabove, so the implementation of the electroluminescent display panel may refer to that of the above-mentioned pixel arrangement structure, which will not be particularly defined herein.

When the adjacent first virtual quadrilaterals are arranged in the row direction and the column direction in such a manner as to share sides, it means that the two first virtual quadrilaterals adjacent to each other in the row direction share a side in the column direction, and the two first virtual quadrilaterals adjacent to each other in the column direction share a side in the row direction.

When the adjacent first virtual quadrilaterals share the sides, the two adjacent first virtual quadrilaterals share a same side, but the two adjacent first quadrilaterals have different shapes, i.e., have different interior angles.

In some embodiments of the present disclosure, the electroluminescent display panel further includes a pixel definition layer, the pixel definition layer includes a plurality of pixel definition layer openings, the first subpixels, the second subpixels and the third subpixels correspond to the pixel definition layer openings respectively, and a shape of each of the first subpixels, the second subpixels and the third subpixels is approximately same to a shape of the corresponding pixel definition layer opening.

In some embodiments of the present disclosure, each first subpixel includes a plurality of film layers at least partially covering a region beyond the corresponding pixel definition layer opening, and/or each second subpixel includes a plurality of film layers at least partially covering a region beyond the corresponding pixel definition layer opening, and/or each third subpixel includes a plurality of film layers at least partially covering a region beyond the corresponding pixel definition layer opening.

In some embodiments of the present disclosure, at least a part of the pixel definition layer openings have different shapes or areas.

In some embodiments of the present disclosure, the pixel definition layer openings include second pixel definition layer openings corresponding to the second subpixels, and a distance between boundaries of at least a part of the adjacent second pixel definition layer openings is greater than a predetermined threshold. In this way, the adjacent second subpixels are spaced apart from each other by a certain distance for a spacer, so as to support the FMM. The predetermined threshold is within a range of 5 μm to 10 μm, e.g., 5 μm, 6 μm, 7 μm, 8 μm, 9 μm or 10 μm.

In some embodiments of the present disclosure, the electroluminescent display panel further includes a spacer arranged adjacent to two second subpixels, one first subpixel and one third subpixel. A minimum distance between boundaries of the first subpixel and the third subpixel is greater than a minimum distance between boundaries of at least a part of the first subpixels and the third subpixels adjacent to each other, e.g., a minimum distance between the boundaries of the first subpixel and the third subpixel adjacent to each other in the row direction and a minimum distance between the boundaries of the first subpixel and the third subpixel adjacent to each other in the column direction. As shown in FIG. 11, one spacer is arranged adjacent to the subpixels P7, P8, P5 and P10. A minimum distance between the boundaries of the subpixels P7 and P8 is U, and U is greater than a minimum distance between the boundaries of the subpixels P2 and P3 adjacent to each other in a same row, or a minimum distance between the boundaries of the subpixels P8 and P13 adjacent to each other in a same column.

Based on a same inventive concept, the present disclosure further provides in some embodiments a display device, including the above-mentioned electroluminescent display panel. The display device is any product or member having a display function, e.g., mobile phone, tablet computer, television, display, laptop computer, digital photo frame or navigator. The implementation of the display device may refer to that of the display panel, and thus will not be particularly defined herein.

Based on a same inventive concept, the present disclosure further provides in some embodiments an FMM for manufacturing the above-mentioned display substrate. The FMM includes a plurality of opening regions, e.g., first opening regions corresponding to the first subpixels, second opening regions corresponding to the second subpixels, or third opening regions corresponding to the third subpixels. A principle of the FMM for solving the problem is similar to that of the display substrate mentioned hereinabove, so the implementation of the FMM may refer to that of the display substrate, which will thus not be particularly defined herein.

In some embodiments of the present disclosure, each first subpixel includes a plurality of film layers, each second subpixel includes a plurality of film layers, and each third subpixel includes a plurality of film layers. A shape and distribution of the first opening region are approximately same to a shape and distribution of at least one film layer in the first subpixel, a shape and distribution of the third opening region are approximately same to a shape and distribution of at least one film layer in the third subpixel, and a shape and distribution of the second opening region are approximately same to a shape and distribution of at least one film layer in the second subpixel.

In a possible embodiment of the present disclosure, a distance between adjacent first opening regions is greater than or equal to a process limit distance, so as to reduce the occurrence of crosstalk.

In a possible embodiment of the present disclosure, a distance between adjacent second opening regions is greater than or equal to a process limit distance, so as to reduce the occurrence of crosstalk.

In a possible embodiment of the present disclosure, a distance between adjacent third opening regions is greater than or equal to a process limit distance, so as to reduce the occurrence of crosstalk.

It should be appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display device, comprising a display substrate, wherein the display substrate comprises a plurality of first subpixels, a plurality of second subpixels and a plurality of third subpixels, wherein
in a first direction, the first subpixels and the third subpixels are arranged alternately to form a plurality of first subpixel rows, the second subpixels are arranged to form a plurality of second subpixel rows, and the first subpixel rows and the second subpixel rows are arranged alternately in a second direction;
lines connecting centers of two first subpixels and two third subpixels in two adjacent rows and two adjacent columns form a first virtual quadrilateral, the two first subpixels are arranged at two opposite vertices of the first virtual quadrilateral respectively, the two third subpixels are arranged at the other two opposite vertices of the first virtual quadrilateral respectively, and a corresponding second subpixel is located within the first virtual quadrilateral; and
lines connecting centers of two second subpixels A and B, one first subpixel and one third subpixel in adjacent three rows and adjacent three columns form a virtual parallelogram, the two second subpixels A and B are arranged at two opposite vertices of the virtual parallelogram respectively, the first subpixel and the third subpixel are arranged at the other two opposite vertices of the virtual parallelogram respectively, a line connecting the centers of the second subpixel A and the third subpixel is located on a first straight line, a distance between an orthogonal projection of the center of the first subpixel onto the first straight line and the center of the second subpixel A is x, and the virtual parallelogram comprises an interior angle close to 90°;
wherein the display device further comprises a spacer adjacent to two second subpixels, one first subpixel and one third subpixel, wherein a minimum distance between boundaries of the first subpixel and the third subpixel adjacent to the spacer is greater than a minimum distance between boundaries of at least a part of first subpixels and third subpixels adjacent to each other.

2. The display device according to claim 1, further comprising a pixel definition layer, wherein the pixel definition layer comprises a plurality of pixel definition layer openings, the first subpixels, the second subpixels and the third subpixels correspond to the pixel definition layer openings respectively, and a shape of each of the first subpixels, the second subpixels and the third subpixels is approximately same to a shape of the corresponding pixel definition layer opening.

3. The display device according to claim 2, wherein each first subpixel comprises a plurality of film layers at least partially covering a region beyond the corresponding pixel definition layer opening, and/or each second subpixel comprises a plurality of film layers at least partially covering a region beyond the corresponding pixel definition layer opening, and/or each third subpixel comprises a plurality of film layers at least partially covering a region beyond the corresponding pixel definition layer opening; or
wherein at least a part of the pixel definition layer openings have different shapes or areas.

4. The display device according to claim 1, wherein x is within a range of 3 μm to 5 μm.

5. The display device according to claim 1, wherein the interior angle is greater than or equal to 70° and smaller than 90°.

6. The display device according to claim 1, wherein a line connecting the centers of the first subpixel and the third subpixel adjacent to each other in the first direction is angled relative to the first direction by an angle d, a line connecting the centers of the first subpixel and the third subpixel adjacent to each other in the second direction is angled relative to the second direction by an angle e, the angle d is greater than 0° and smaller than 30°, and the angle e is greater than 0° and smaller than 30°.

7. The display device according to claim 1, wherein the first direction is perpendicular to the second direction, the first direction is one of a row direction and a column direction, and the second direction is the other one of the row direction and the column direction.

8. The display device according to claim 1, wherein four first virtual quadrilaterals in two columns and two rows are arranged in such a manner as to share common sides to form a second virtual polygon, and the second virtual polygon comprises four second subpixels, five first subpixels and four third subpixels;
the four second subpixels are located within the four first virtual quadrilaterals respectively, one first subpixel is surrounded by the four second subpixels, the other four first subpixels and the four third subpixels are arranged at vertices and sides of the second virtual polygon respectively, and the four first subpixels and the four third subpixels at the vertices and sides of the second virtual polygon are arranged alternately in a clockwise direction and a counterclockwise direction along the sides of the second virtual polygon; and
lines connecting the centers of the four first subpixels at the vertices of the second virtual polygon approximately form a virtual parallelogram, and/or lines connecting the centers of the four third subpixels at the sides of the second virtual polygon approximately form a virtual parallelogram.

9. The display device according to claim 8, wherein a line connecting centers of at least a part of the first subpixels is approximately located on a third straight line, a line connecting centers of at least a part of the third subpixels is approximately located on a fourth straight line, and the third straight line is approximately parallel to the fourth straight line,
wherein the third straight line and the fourth straight line do not coincide with each other, and are approximately parallel to the first direction; or
the third straight line and the fourth straight line do not coincide with each other, and are approximately parallel to the second direction.

10. The display device according to claim 9, wherein a line connecting the centers of at least a part of the second subpixels in a same second pixel row is approximately located on a fifth straight line, the fifth straight line is approximately parallel to the third straight line and the fourth straight line.

11. The display device according to claim 1, wherein a line connecting the centers of the second subpixels adjacent to each other in the first direction is angled relative to the first direction by an angle f, a line connecting the centers of the second subpixels adjacent to each other in the second direction is angled relative to the second direction by an angle g, the angle f is greater than 0° and smaller than 30°, and the angle g is greater than 0° and smaller than 30°.

12. The display device according to claim 1, wherein four third subpixels are arranged adjacent to each first subpixel, and distances between the center of the first subpixel and the centers of at least two of the four third subpixels are different from each other;
four first subpixels are arranged adjacent to each third subpixel, and distances between the center of the third subpixel and the centers of at least two of the four first subpixels are different from each other.

13. The display device according to claim 8, further comprising a plurality of pixel repetition units, wherein each pixel repetition unit comprises two first subpixels and two third subpixels belonging to a same first virtual quadrilateral, and further comprises four second subpixels belonging to a same second virtual polygon as one first subpixel of the two first subpixels and surrounding the one first subpixel.

14. The display device according to claim 1, wherein each second subpixel is of an octagonal shape.

15. The display device according to claim 1, wherein the first subpixels have a same area, and the third subpixels have a same area, and the second subpixels have a same area,
wherein each first subpixel has an area of S, each second subpixel has an area of f*S, and each third subpixel has an area of g*S, where $0.5 \leq f < 0.8$ and $1 \leq g \leq 2.2$.

16. The display device according to claim 1, wherein the first subpixels have an approximately same shape, and/or the third subpixels have an approximately same shape, and/or the second subpixels have an approximately same shape.

17. The display device according to claim 1, wherein each of the first subpixels and the third subpixels has a shape of polygon, circle or oval, wherein the shape of polygon comprises a shape of quadrilateral, hexagon, octagon, quadrilateral with rounded angles, hexagon with rounded angles, or octagon with rounded angles.

18. The display device according to claim 1, wherein the first subpixel is a red subpixel, the third subpixel is a blue subpixel and the second subpixel is a green subpixel; or the first subpixel is a blue subpixel, the third subpixel is a red subpixel and the second subpixel is a green subpixel; or the first subpixel is a green subpixel, the third subpixel is a red subpixel and the second subpixel is a blue subpixel; or the first subpixel is a green subpixel, the third subpixel is a blue subpixel and the second subpixel is a red subpixel.

* * * * *